(12) United States Patent
Norman

(10) Patent No.: US 7,633,789 B2
(45) Date of Patent: Dec. 15, 2009

(54) PLANAR THIRD DIMENSIONAL MEMORY WITH MULTI-PORT ACCESS

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 57 days.

(21) Appl. No.: 11/999,376

(22) Filed: Dec. 4, 2007

(65) Prior Publication Data

US 2009/0141545 A1 Jun. 4, 2009

(51) Int. Cl.
*G11C 11/00* (2006.01)
(52) U.S. Cl. .................. 365/148; 365/158; 365/230.03; 365/54; 365/63
(58) Field of Classification Search .............. 365/148, 365/158, 230.03, 52, 54, 63
See application file for complete search history.

(56) References Cited

U.S. PATENT DOCUMENTS 6,839,269 B2 * 1/2005 Iwata et al. ................ 365/158
7,394,717 B2 * 7/2008 Hidaka ................ 365/230.03

OTHER PUBLICATIONS

Saleh, Res "SRAM Cell and col. I/O Design", EECE481 Lecture 18, Dept. of ECE, University of British Columbia, Mar. 16, 2005, pp. 1-10.

* cited by examiner

*Primary Examiner*—David Lam

(57) ABSTRACT

Embodiments of the invention relate generally to a planar third dimensional memory with multi-port access, the planar third dimensional memory including memory planes composed of a plurality of memory layers. The memory layers can include non-volatile memory elements. The planar third dimensional memory can also include insulation layers, each being formed to separate a memory layer from another memory layer, and a logic plane configured to control access to the plurality of memory planes. In some cases, the memory planes can be formed vertically above the logic plane. The logic plane can be formed in a substrate, such as a semiconductor wafer, for example. The planar third dimensional memory can include a multi-port interface that can be configured to provide access between a plurality of ports and the plurality of memory planes.

26 Claims, 9 Drawing Sheets

PLANAR THIRD DIMENSIONAL MEMORY WITH MULTI-PORT ACCESS

CROSS-REFERENCE TO RELATED APPLICATIONS

This application is related to U.S. patent application Ser. No. 11/095,026, filed Mar. 30, 2005, U.S. Published Application No. 2006/0171200, and entitled "Memory Using Mixed Valence Conductive Oxides," which is herein incorporated by reference for all purposes.

FIELD OF THE INVENTION

Embodiments of the invention relate generally to semiconductors and memory technology. More specifically, a planar third dimensional memory with multi-port access is described to implement, for example, a multi-port register file.

BACKGROUND

Computing systems have increasingly required faster computing memory to transmit billions of instructions to and from a central processing unit ("CPU") promptly for execution. These CPUs have dramatically become faster and more complex in the computing industry. To reduce access times by the CPU to data stored in computer memory, some conventional approaches have implemented the use of processor registers to provide quick access to commonly used values within the CPU. At least one approach implements an array of processor registers to meet the demand of increasing memory requirements.

In some conventional approaches, computing systems have become more complex and costly with the increasing need for multiple ports to share data across multiple processors. In some other conventional approaches, direct memory access ("DMA") controllers have been implemented to ameliorate computing memory traffic independent of the CPU. This approach, however, does not provide optimal system performance since conventional approaches use multiple integrated circuits, which therefore might increase system latency. Alternatively, computing memory is used for a number of electronic devices using offline applications during which power is often absent. As electronic devices and CPUs become increasingly smaller and faster, requirements for computing memories with reduced cost, size, and power demands are also desirable. However, conventional approaches fail to fulfill these requirements, and data is often loss when power is removed. Typically, when power is lost, data is also lost in volatile systems.

Thus, a solution is needed to provide for a nonvolatile memory having multiple ports in which to access memory locations, without the limitations of conventional techniques.

BRIEF DESCRIPTION OF THE DRAWINGS

Various examples are disclosed in the following detailed description and the accompanying drawings.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, examples, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, planar third dimensional memory with multi-port access is described. Using non-volatile third dimensional memory such as that described in U.S. patent application Ser. No. 11/095,026, filed Mar. 30, 2005, U.S. Published Application No. 2006/0171200, entitled "Memory Using Mixed Valence Conductive Oxides," and which is herein incorporated by reference in its entirety for all purposes, non-volatile third dimensional memory may be arranged in a two-terminal, vertically-configured or stacked, cross-point memory array ("array"). Memory structures may be implemented using third dimensional memory arrays with gating transistors that are configured to control and manage access using multiple paths (e.g., read path with another read path or write path, and the like). Further memory structures may be implemented using multiple ports accessing third dimensional memory arrays across multiple parallel planes. The described techniques may be used to emulate of other memory technologies by duplicating the interface signals and protocols, while allowing multi-port access to the third dimensional memory array. For example, third dimensional memory can be used to form a register file, whereby the third dimensional memory is implemented to emulate an SRAM-based register file. Thus, a third dimensional, planar memory structure may be implemented to allow simultaneous or substantially simultaneous data access using two or more data ports.

Figure 1:
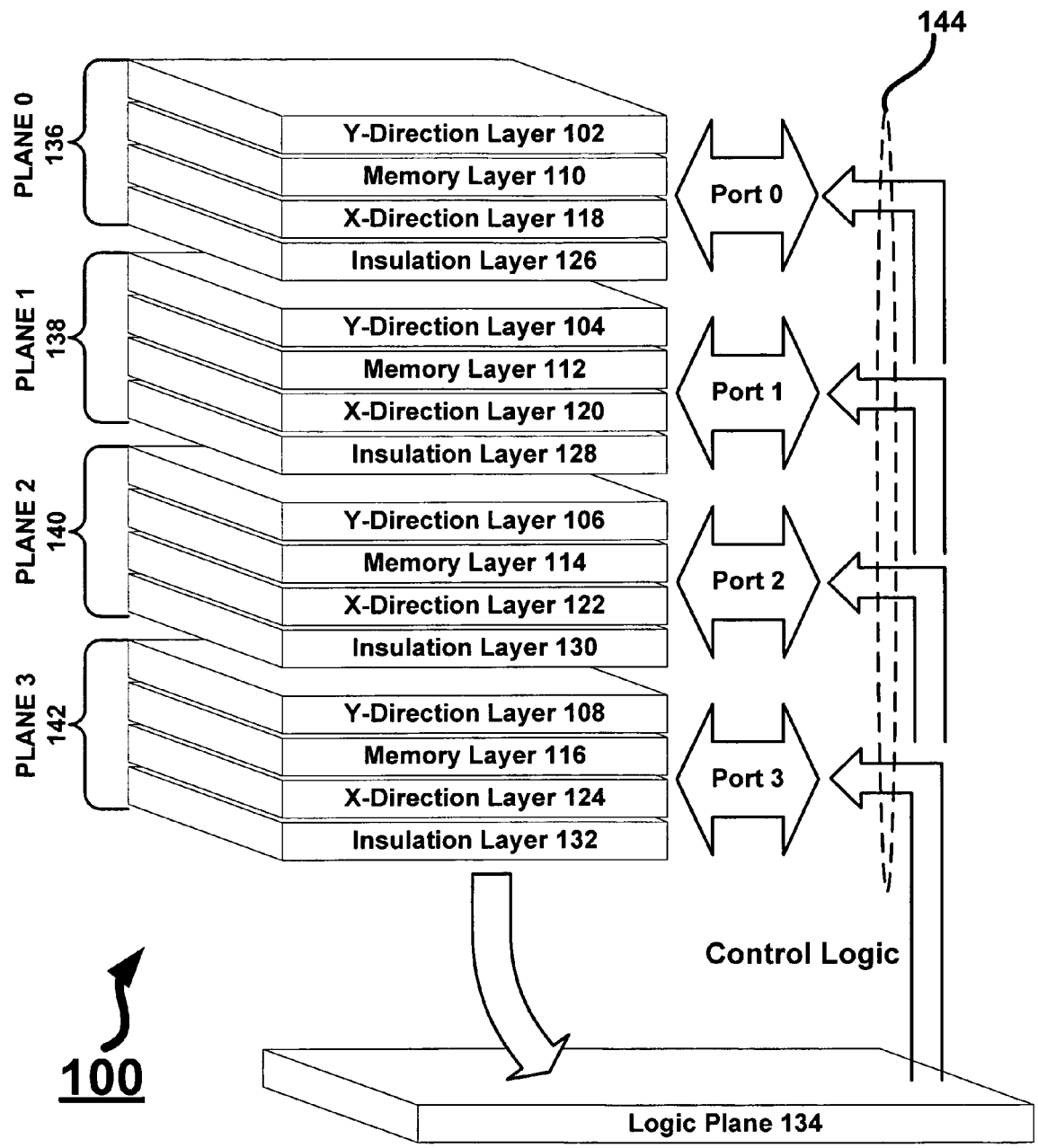
FIG. 1 illustrates an exemplary cross-sectional view of a vertically configured planar third dimensional memory array.

FIG. 1 illustrates an exemplary cross-sectional view of a vertically configured planar third dimensional memory array. Here, memory array 100 includes y-direction conductive layers 102-108, memory layers 110-116, x-direction conductive layers 118-124, insulation layers 126-132, logic plane 134, memory planes 136-142, and multi-port interface 144. In some examples, memory array 100 includes logic plane 134, which may be configured vertically adjacent to one, two, three, or multiple (i.e., "n") memory planes 136-142. Each of memory planes 136-142 may be used for implementing different aspects of a memory system. For example, a base plane of memory array 100 (e.g., logic plane 134) may be used to implement control logic (i.e., set of logic gates representing control circuitry) or an interface between memory elements in a memory system, while memory layers 110-116 may be used to implement memory. In addition, memory array 100 employs multi-port interface 144, whereby memory planes 136-142 may be coupled to multiple ports. Still, each port may be dedicated to one of the memory planes for data access (i.e., data transferred during read and write operations).

In other examples, memory array 100 includes y-direction conductive layers 102-108, which may be configured to conduct electrical energy to memory layers 110-116. Each of y-direction conductive layers 102-108 and x-direction conductive layers 118-124 interact with memory layers 110-116 to access a memory element collectively. For example, a conductive layer (e.g., y-direction conductive layer 102) may be used to implement logic voltages to the memory element. Also, logic voltages may refer to a logical state read from or written to memory layers 110-116, which include bit lines coupled to each of memory layers 110-116. In still other examples, memory array 100 includes x-direction conductive layers 118-124, which may be configured to enable access from a port to each of memory layers 110-116. For example, another conductive layer (e.g., x-direction conductive layers 118-124) may be used to pass a voltage to control logic that selects an element within a memory layer.

In some examples, memory array 100 includes memory planes 136-142 having a subset of y-direction conductive layers 102-108, x-direction conductive layers 118-124, memory layers 110-116, and insulation layers 126-132. For example, each memory plane may be configured to access data autonomously, by which each memory plane has separate conductive lines (e.g., x-direction conductive layers, y-direction conductive layers) forming boundaries from other memory planes. Further, insulation layers 126-132 may be configured to isolate each of memory planes 136-142 from other memory planes (i.e., a boundary between memory planes), thus preventing some electrical interference from a memory plane to another memory plane. Alternatively, isolated memory planes provide dedicated memory access for each port belonging to a multi-port interface, whereby the multi-port interface is a collection of communication points composed of multiple access ports. As a further example, memory planes 136-142 may provide read and write access using a shared dataset among other memory planes.

Still further, memory layers 110-116 may be used to implement 'n' number of memory types, where each of memory layers 110-116 are configured to emulate a different type of memory (e.g., SRAM, DRAM, NOR, NAND, Flash®, and others). Still further, each of memory layers 110-116 may be configured, formed, fabricated, or otherwise implemented entirely or partially to emulate a memory type. In other examples, memory layers 110-116 may be implemented as the same memory type. In still other examples, the number of memory layers 110-116 may be varied to include more, fewer, or different layers than those shown and described. In some examples, more, fewer, or different layers than those shown may be used. In other examples, memory array 100 and the above-described elements may be varied and are not limited to the functions, structures, configurations, or implementations provided.

Figure 2:
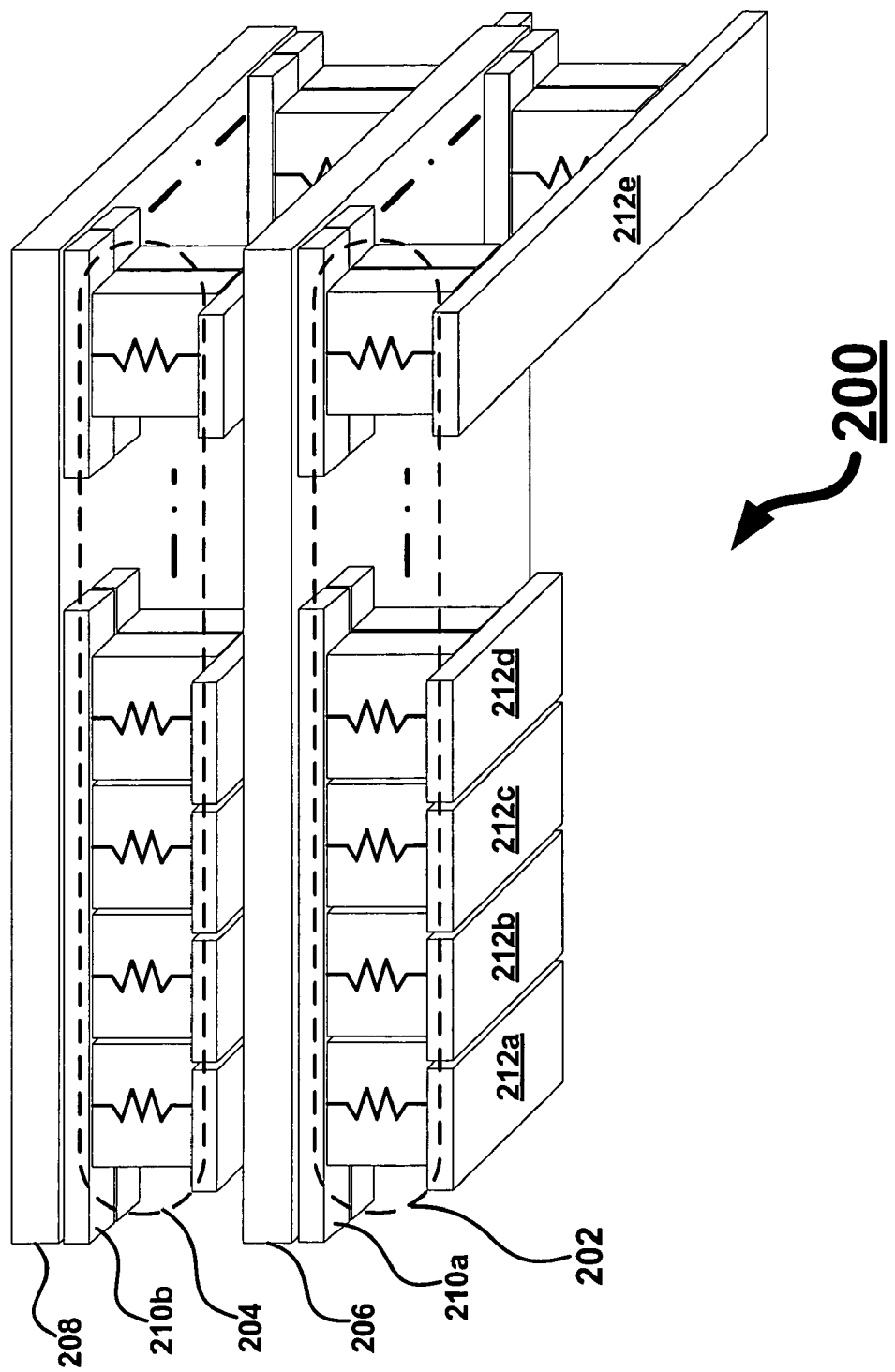
FIG. 2 illustrates a perspective view of an exemplary planar third dimensional memory array using a cross-point architecture.

FIG. 2 illustrates a perspective view of an exemplary planar third dimensional memory array using a cross-point architecture. Here, cross-point memory array 200 (e.g., cross-point array 200) includes memory layers 202-204, insulation layers 206-208, x-direction conductive array lines 210a-b, and y-direction conductive arrays lines 212a-e. In some examples, cross-point array 200 employs two memory layers 202-204. Memory layers, 202-204, are sandwiched between alternating layers of x-direction conductive array lines 210a-b and y-direction conductive arrays lines, 212a-e. Stacking permits for a memory device to increase memory capacity without increasing the footprint of cross point array 200. A "memory layer," as the term is used herein, is not necessarily a homogenous layer of material, but a layer of memory plugs. Memory plugs can be made up of several different layers of materials (e.g., ferroelectric, perovskite, and others). The term "plug" is meant to be generally applicable to any stack or formation between complementary conductive array lines, and not intended to be limited to any manufacturing process. In some examples, cross-point array 200 and the above-described elements (i.e., all elements shown and indicate by reference numerals above) may be implemented differently in design, operation, configuration, and materials, and are not limited to the descriptions provided herein.

Figure 3:
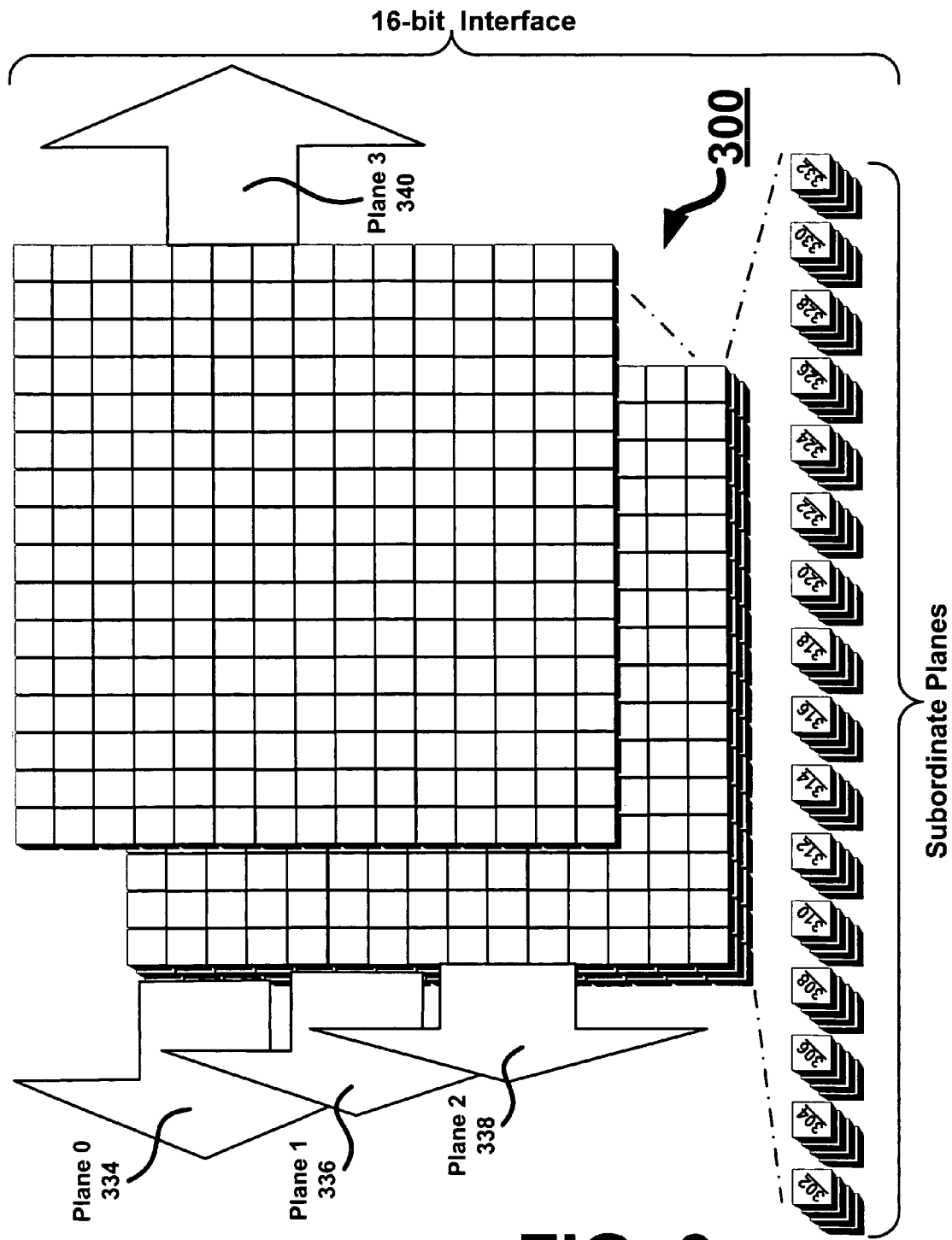
FIG. 3 illustrates a perspective view of an exemplary planar third dimensional memory array.

FIG. 3 illustrates a perspective view of an exemplary planar third dimensional memory array. Here, planar third dimensional memory array 300 includes subordinate planes 302-332 and memory planes 334-340. In some examples, planar third dimensional memory array 300 has multi-port access in which each memory plane is coupled to a port. In other examples, register file systems employ multi-port accessing that include bus interfaces (e.g., 16-bit data). For example, planar third dimensional memory array 300 employs a 16-bit interface, whereby each bit is multi-port accessible through the implementation of multiple memory planes with subordinate planes. Planar third dimensional memory array 300 vertically stacks memory planes, whereby each memory plane employs 256 subordinate planes. In other examples, more, fewer or different memory planes and subordinate planes than those shown may be used. Each subordinate plane may be used to implement an independent memory array within planar third dimensional memory array 300. In addition, each subordinate plane may be accessible among other subordinate planes in the same memory plane while connected to a port (i.e., port is dedicated to a memory plane) using decoder logic. In other examples, planar third dimensional memory array 300 employs four memory planes 334-340. Each memory plane may be configured in parallel to other memory planes of equal size (i.e., each memory plane will store equal amounts of memory elements). In still other examples, planar third dimensional memory array 300 includes a master port to direct read or write operations across all memory planes (i.e., memory planes 334-340). In one example, memory plane 334 ("plane 0") is designated to port 0 as the master port, which is configured to receive a dataset to be written to all memory planes. Also, plane 0 may be commanded (i.e., control signals based on a given set of logic) to perform a read operation from port 0. Alternatively, port 0 while coupled to plane 0 may support a bidirectional data flow path ("datapath") to perform both read and write operations. In another example, memory plane 336 ("plane 1") may be coupled to port 1 to provide read access from plane 1. In still another example, memory plane 338 ("plane 2") may be coupled to port 2 to provide read access from plane 2. A further example, memory plane 340 ("plane 3") may be coupled to port 3 to provide read access from plane 3. Additionally, each reading operation performed for each memory plane accesses the same dataset stored in each memory plane. This duplication, redundancy, multiplication, or otherwise replication ("replication") of datasets across all memory planes provides simultaneous or substantially simultaneous access to planar third dimensional memory array 300. The above-described examples of planar third dimensional memory array 300 refer to a 16-bit interface where other planes coupled to other ports may support unidirectional datapaths but are not limited to bidirectional implementations. Alternatively, 8, 16 or 32 bits in parallel may be simultaneously or substantially simultaneously accessed, which are not shown for purposes of clarity. In some examples, planar third dimensional memory array 300 and the above-described elements (i.e., all elements shown and indicated by reference numerals above) may be implemented differently in design, operation, configuration, and materials, and are not limited to the descriptions provided herein.

Figure 4:
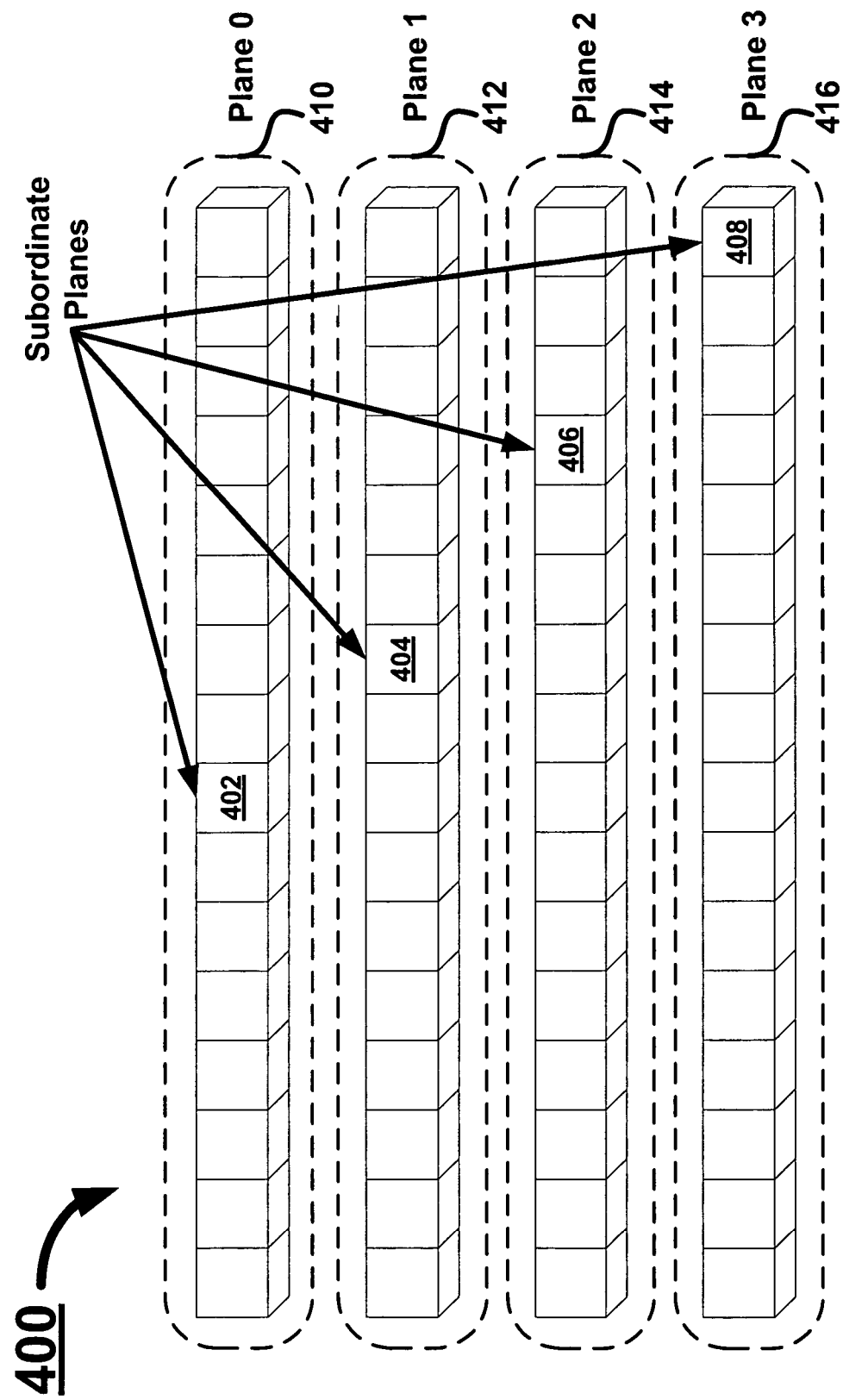
FIG. 4 illustrates an exemplary cross-sectional view of subordinate planes disposed in a planar third dimensional memory array.

FIG. 4 illustrates an exemplary cross-sectional view of subordinate planes disposed in a planar third dimensional memory array. Here, memory array 400 includes subordinate planes 402-408 and memory planes 410-416. In some examples, each memory plane (e.g., memory planes 410-416) may be subdivided into smaller planes (e.g., subordinate planes 402-408) in parallel to other memory planes. In some examples, subdividing memory planes may provide faster access times to/from memory array 400. In other examples, more, fewer, or different subordinate planes than those shown may be used. Each subordinate plane may be configured adjacent to other subordinate planes to form one memory plane. For example, subordinate plane 402 is disposed in memory plane 410 ("plane 0") among other subordinate planes (e.g., subordinate planes 404-408). Each subordinate plane may be an array of memory elements that may be accessed independent of other memory elements disposed in other subordinate planes. In other examples, each memory plane may be dedicated to one port, which may address a subset of subordinate planes to be selected for a memory operation (e.g., read and write operations). In a further example, memory plane 412 ("plane 1") may be selected to perform a read operation simultaneous or substantially simultaneous to plane 0 (e.g., memory plane 410), which may be performing another read operation. Alternatively, a dataset (i.e., an array of logical states) may be written to each of memory planes 410-416 to be accessed by multiple ports requesting the same dataset. In other examples, memory array 400 and the above-described elements (i.e., all elements shown and indicate by reference numerals above) may be implemented differently in design, operation, configuration, and materials, and are not limited to the descriptions provided herein.

Figure 5:
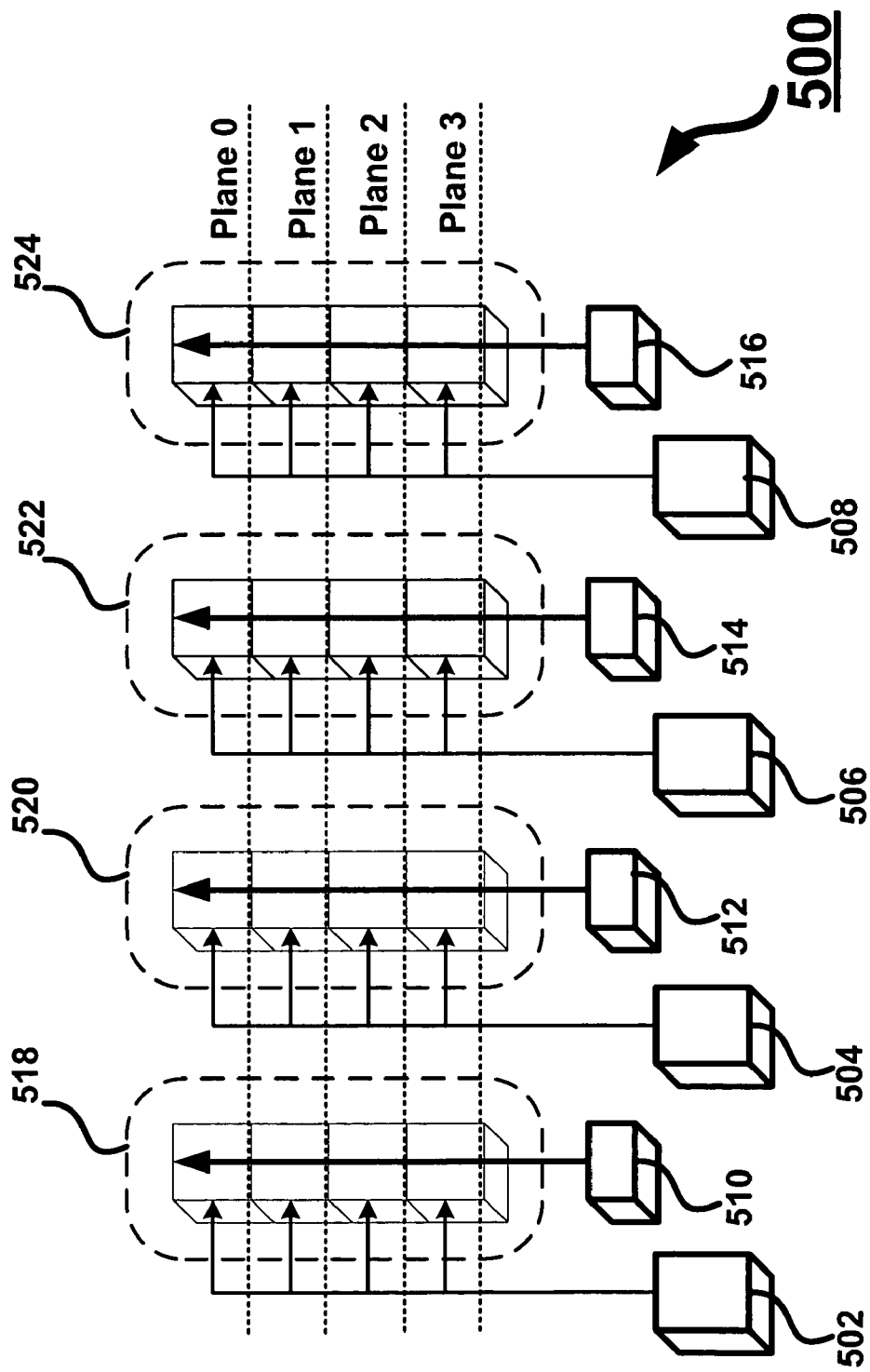
FIG. 5 illustrates an exemplary cross-sectional view of subordinate planes with isolated conductive array lines.

FIG. 5 illustrates an exemplary cross-sectional view of subordinate planes with isolated conductive array lines. Here, system 500 includes y-direction conductive array lines 502-508, x-direction conductive array lines 510-516, and subordinate plane arrays 518-524. In some examples, system 500 may perform write operations to each subordinate plane (i.e., subordinate plane arrays 518-524) independent of other subordinate planes. In other examples, each subordinate plane may be driven by a common x-direction line (e.g., x-direction conductive array lines 510-516) to enable each memory plane for write access. The dataset may be received by a memory plane (e.g., plane 0) connected to a port for storing to all memory planes. In still other examples, each subordinate plane may be driven by a series of voltage levels to a y-direction line (e.g., y-direction conductive array lines 502-508) to store the dataset across all memory planes. Each subordinate plane, however, may be written to at different times, whereby each subordinate plane may have different subsets of the dataset written to. Alternatively, writing to a subordinate plane may be performed to all memory planes at once. In addition, simultaneous or substantially simultaneous writing to all memory planes may be provided by conducting x-direction conductive array line 510. In still other examples, y-direction line decoding may be performed to differentiate a subordinate plane from another subordinate plane. A further example, subordinate plane 518 may be selected to store a subset of the dataset, which may be provided a first voltage or a second voltage from y-direction conductive array line 502. In some examples, system 500 and the above-described elements (i.e., all elements shown and indicate by reference numerals above) may be implemented differently in design, operation, configuration, and materials, and are not limited to the descriptions provided herein.

Figure 6:
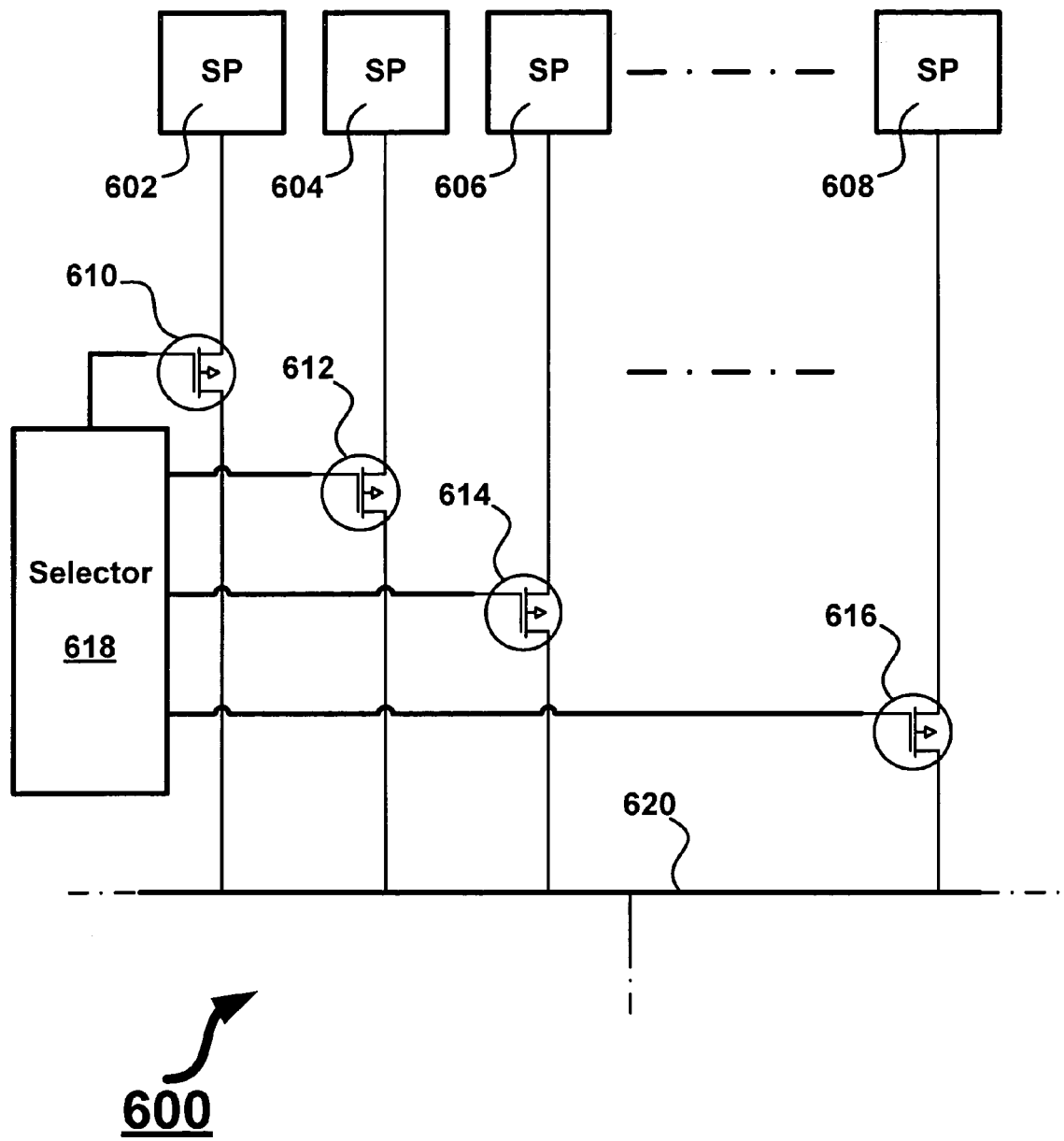
FIG. 6 illustrates an exemplary view of a single memory plane using subordinate plane decoding.

FIG. 6 illustrates an exemplary view of a single memory plane using subordinate plane decoding. Here, system 600 includes subordinate planes ("SP") 602-608, transistors 610-616, selector 618, and conductive array line 620. In some examples, system 600 may be implemented to provide a path for logical states from independent subordinate planes within a memory plane to route to a designated port. For example, subordinate plane 602 is autonomous from subordinate plane 604, thus, selector 618 may decode a potential from subordinate plane 602 to pass on to conductive array line 620. In a further example, selector 618 may be an addressing circuit that selects the path between the subordinate plane and a port by providing a gate voltage (i.e., activates gate electrode of transistor) to a pass transistor (e.g., transistors 610-616) disposed in the path. In some examples, system 600 may include one, two, three, or multiple (i.e., "n") subordinate planes 602-608. In other examples, transistor structures may include a channel using n-type or p-type semiconductor material. In still other examples, there may be a combination of p-type and n-type semiconductor material to form other types of structures. Further, multiple memory arrays (e.g., subordinate planes 602-608) may be implemented and are not limited to the examples shown and described.

Figure 7:
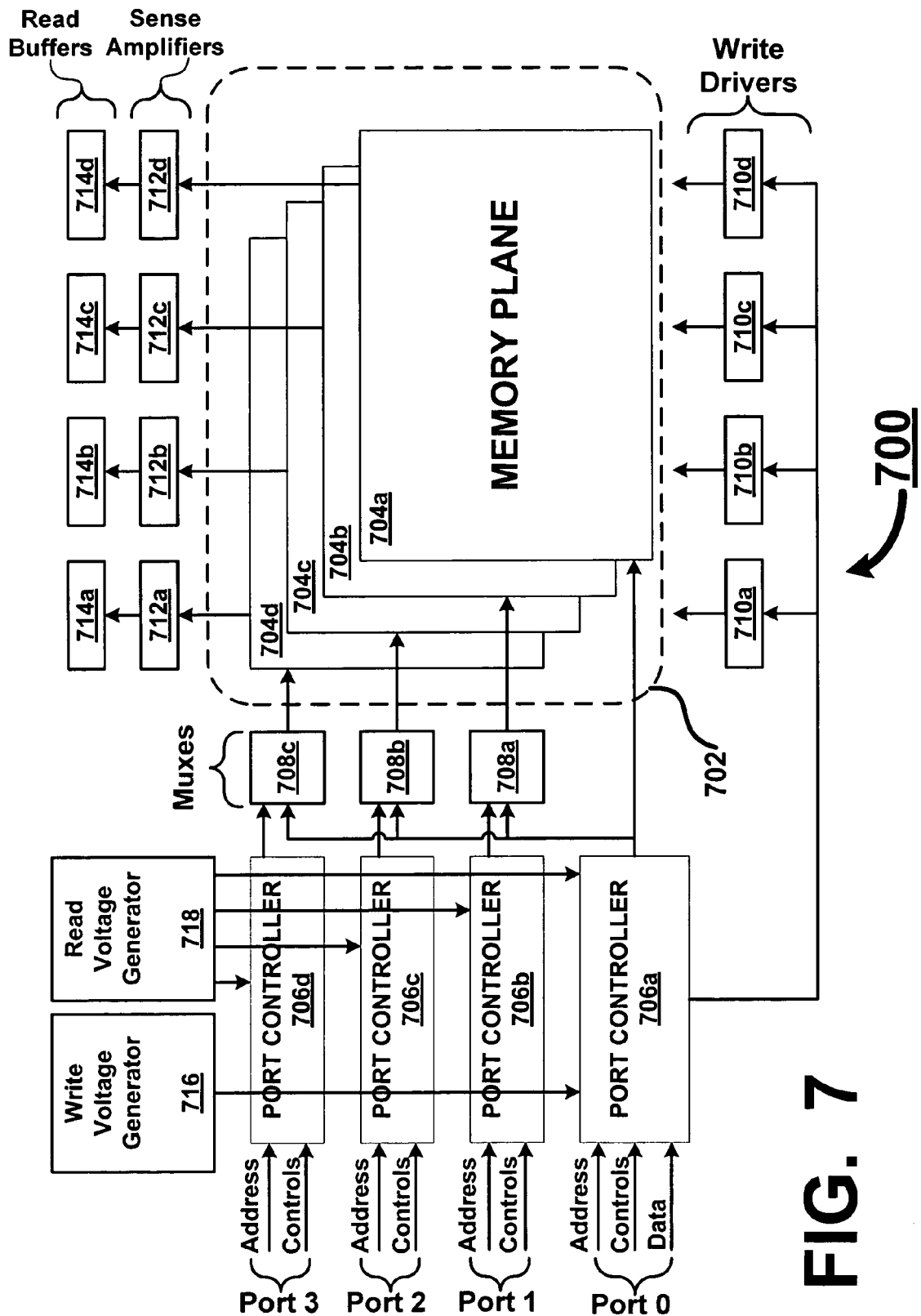
FIG. 7 illustrates an exemplary view of a read and write datapath in a register file system.

FIG. 7 illustrates an exemplary view of a read and write datapath in a register file system. Here, system 700 includes third dimensional memory array 702, memory planes 704a-d, port controllers 706a-d, multiplexers 708a-c, write drivers 710a-d, sense amplifiers 712a-d, read buffers 714a-d, write voltage generator 716, and read voltage generator 718. In some examples, memory array 702, which may include one, two, three, or multiple (i.e., "n") memory planes 704a-d. Further, multiple memory arrays (e.g., third dimensional memory array 702) may be implemented and are not limited to the examples shown and described.

In some examples, system 700 may be implemented to provide multiport access to third dimensional memory array 702 (i.e., memory array 702), to perform both read and write operations, as described in further detail below. Here, system 700 may be configured to read and write data from/to third dimensional memory array 702 simultaneously or substantially simultaneously using multiple ports, as shown and described. In selecting a memory plane (e.g., memory planes 704a-d) within third dimensional memory array 702, for example, memory system 700 may include port controller 706 to access a memory plane (e.g., memory planes 704a-d). An incoming address may be provided to port controller 706 (e.g., port controllers 706a-d) to locate a given memory plane for selection using multiplexers 708a-c ("muxes"). As a further example, port controller 706a may not require a multiplexer since it may write to all memory planes (e.g., memory planes 704a-d) of memory array 702 when designated as a master port. Port controller 706 may provide commands (i.e., generation and transmission of control signals based on a given set of logic) of operations (e.g., read and write operations), providing voltages (i.e., "voltage enables," which are voltages that enable or activate a given component, such as those described herein) to be gated to a given memory plane (e.g., plane ("0") 136 (FIG. 1)) to turn on (i.e., activate) gate logic (e.g., logic residing in logic plane 134 (FIG. 1)). For example, depending on the operation indicated by port controller 706a, voltages may travel through a bit line (e.g., y-direction conductive array lines) from write driver 710a (e.g., write drivers 710a-d) or to sense amplifier 712a (e.g., sense amplifiers 712a-d). In some examples, the master port (e.g., port controller 706a) may perform write operations to all memory planes (e.g., third dimensional memory array 702) using system 700. Write operations may only be handled by the master port. In other examples, read operations may be performed using ports not designated as the master port in system 700. In still other examples, read operations may be performed using all ports including the master port in system 700.

In other examples, system 700 may employ the use of other ports comprising of port controller 706 to enable another selected memory plane to perform another operation, for example, a read operation with one of memory planes 704a-d. Using multiple ports as shown in system 700 and described herein, provides simultaneous or substantially simultaneous operations to be performed, such as the read operation as described below. Alternatively, multiple read and write operations may be performed using the multi-port configuration shown, thus providing fast access to/from memory array 702 and memory planes 704a-d. Further, data may be written to memory planes 704a-d without performing an erase operation beforehand, which provides fast access to memory array 702. In still other examples, system 700 and the above-described elements (i.e., all elements shown and indicated by reference numerals above) may be implemented differently in design, operation, configuration, and materials, and are not limited to the descriptions provided herein.

Figure 8:
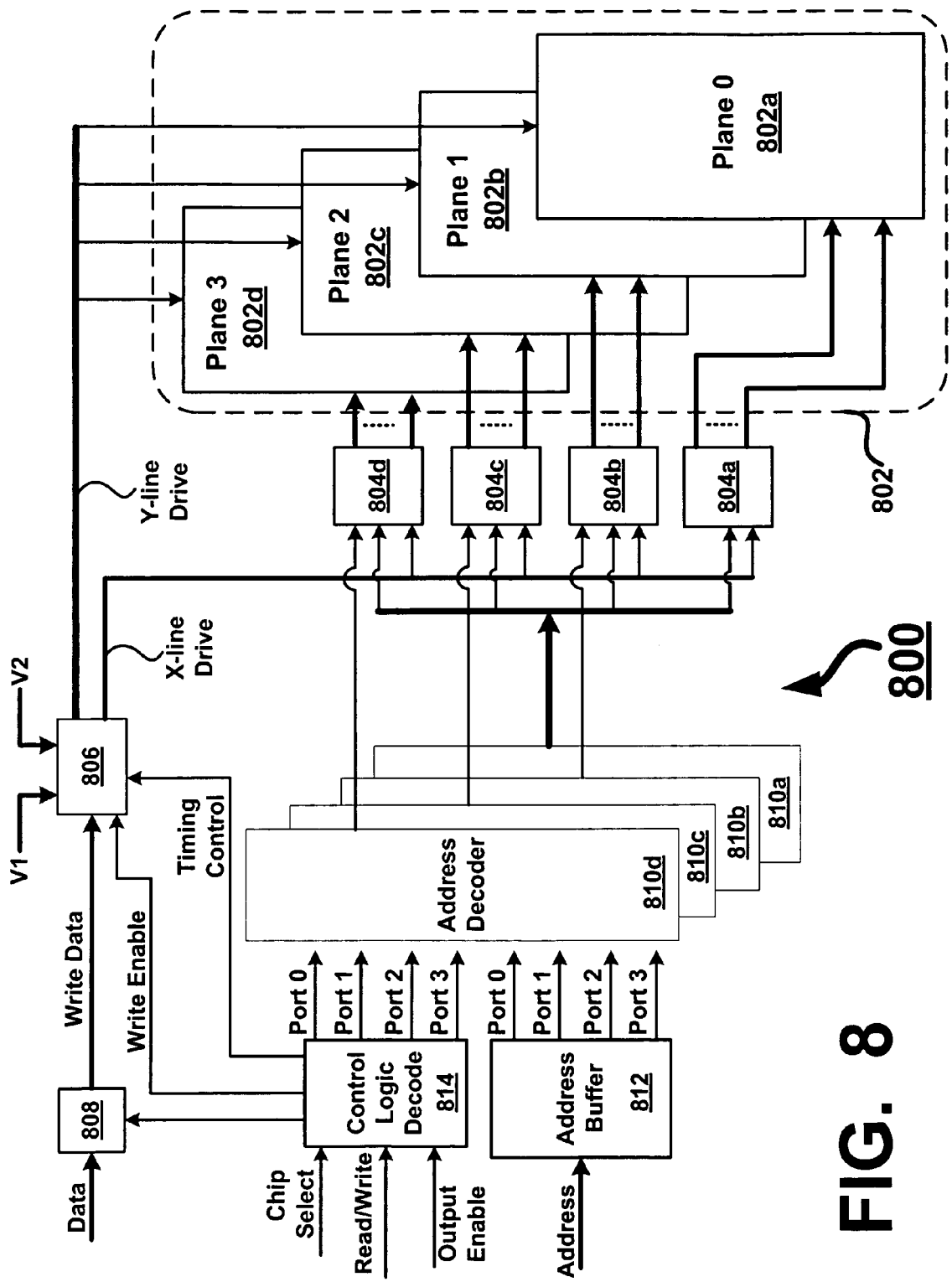
FIG. 8 illustrates an exemplary view of a write datapath in a register file system.

FIG. 8 illustrates an exemplary view of a write datapath in a register file system. Here, system 800 includes third dimensional memory array 802, memory planes 802a-d, multiplexers 804a-d, switch 806, transceiver 808, address decoders 810a-d, address buffer 812, and control decoder 814. In some examples, system 800 may be used to implement an exemplary write datapath for multiple port ("multi-port") access to a third dimensional memory array (e.g., third dimensional memory array 802). Further, multiple memory arrays (e.g., third dimensional memory array 802) may be implemented and are not limited to the examples shown and described. Write operations may be performed by receiving data to be written to memory array 802 and memory planes 802a-d at an interface transceiver (e.g., transceiver 808), which determines the gating voltage (i.e., the driving voltages generated by write drivers 710a-d of FIG. 7) and used to drive conductive array lines (e.g., Y-line drive and X-line drive) to make the desired resistive effect at a selected memory element within memory planes 802a-d. Selection of a memory element (e.g., resistive memory element) within each memory plane is provided by multiplexers 804a-d. Each multiplexer 804 may select a subordinate plane (e.g., subordinate plane 402 (FIG. 4)) among multiple subordinate planes within each memory plane. Each subordinate plane is a third dimensional memory array composed of resistive memory elements. As an example, an address is received at address buffer 812 and provided address decoder 810a through port 0, which generates a decoded address that is used to enable another conductive line to select one or more of memory elements belonging to memory 802a ("plane 0") from memory array 802. A write voltage is provided to one or more of memory planes 802a-d by switch 806. Voltages provided to switch 806 (i.e., program voltages) turn on or activate conductive lines connected to memory array 802. In other examples, program voltages (e.g., V1, V2) may be voltage signals that indicate a "high" voltage (e.g., +2.5V in a range of +2.5V to −2.5V). Potential differences read across one of selected resistive memory elements within memory planes 802a-d may indicate a resistive effect, as described above, has occurred when a voltage generated by write drivers (i.e., driving voltage) is applied to memory planes 802a-d. A resistive effect may be a change from one resistive state to another resistive state, which may be interpreted as a "high" or "low" potential. In still other examples, writing operations may occur with positive voltages, negative voltages, or a combination of positive and negative voltages. In some other examples, memory array 802 may perform write operations simultaneously or substantially simultaneously using single or multiple ports across multiple memory planes. Further, write operations using the write datapath described above or a variation thereof may be performed using multiple ports in third dimensional memory array 802 without requiring an erase operation to be performed beforehand. In other examples, system 800 and the above-described elements (i.e., all elements shown and indicate by reference numerals above) may be implemented differently in design, operation, configuration, and materials, and are not limited to the descriptions provided herein.

Figure 9:
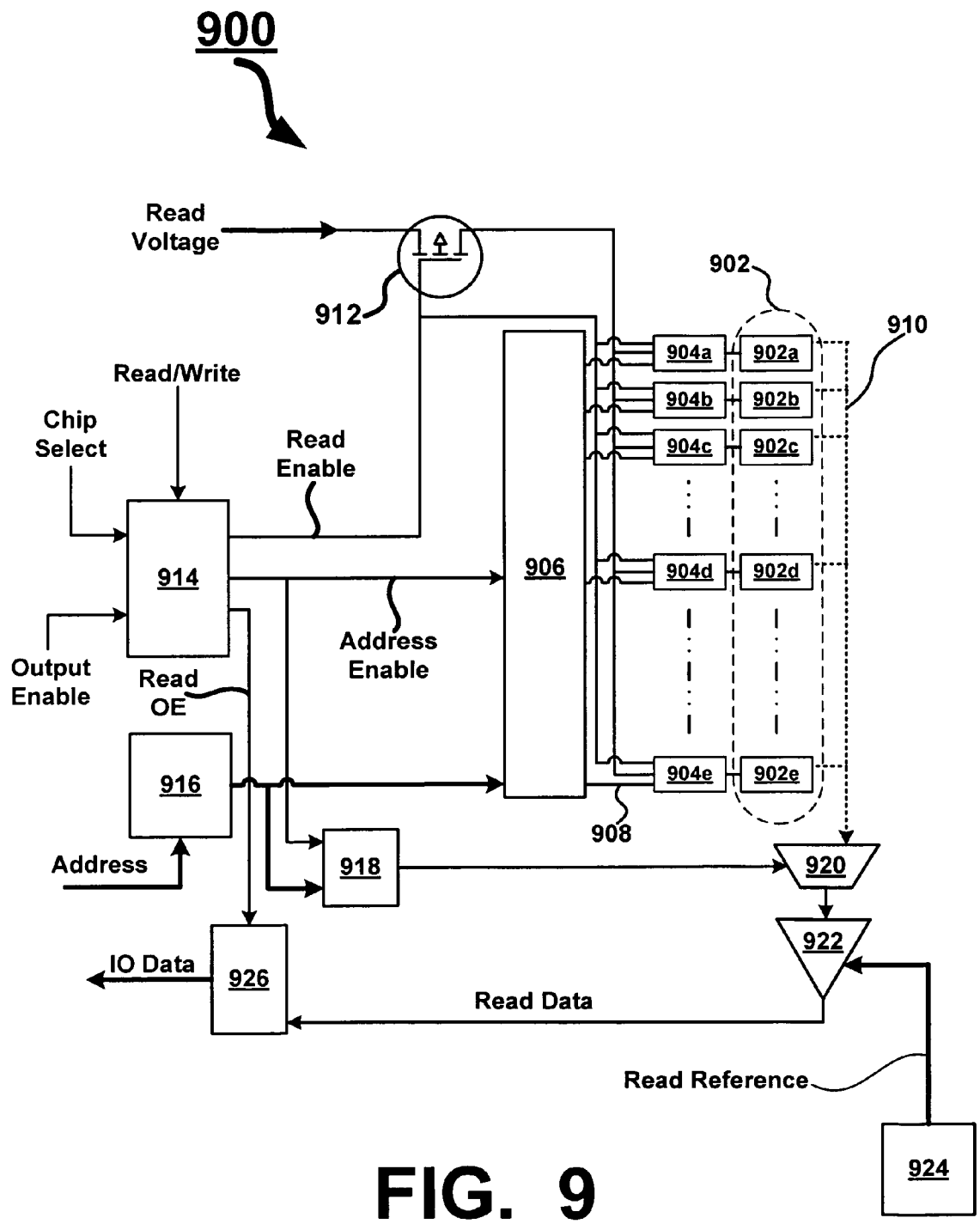
FIG. 9 illustrates an exemplary view of a read datapath for one port in a register file system.

FIG. 9 illustrates an exemplary view of a read datapath for one port in a register file system. Here, system 900 includes third dimensional memory array 902, memory elements 902a-e, read drivers 904a-e, row decoder 906, word line 908, bit line 910, read transistor 912, control logic 914, address buffer 916, column decoder 918, multiplexer 920, sense amplifier 922, reference cell 924, and interface transceiver 926. In some examples, third dimensional memory array 902, which may include one, two, three, or multiple (i.e., "n") memory elements 902a-e. Further, multiple memory arrays (e.g., third dimensional memory array 902) may be implemented and are not limited to the examples shown and described.

In some examples, system 900 illustrates a third dimensional memory array (i.e., memory array 902), with a datapath that may be used to read data from memory array 902. The following examples described the read datapath for system 900, which may be implemented as part of system 700 (FIG. 7). As an example, memory array 902 may use read transistor 912, turned on by a read enable driven by control logic 914. An address is received and provided by address buffer 916 to be decoded by row decoder 906, which uses a decoded address to enable (i.e., activate or provide a gating voltage to) word line 908 (e.g., conductive array line) to select one of memory elements 902a-e within memory array 902. Data is read from one of the selected memory elements (e.g., memory elements 902a-e) by read transistor 912 gating, allowing, supplying, or otherwise providing ("providing") a read voltage to read drivers 904a-e. In some examples, read transistor 912 may enable the read voltage to read drivers 904a-e. A read voltage may be provided to a selected memory element by creating a voltage drop across the selected memory element to bit line 910 (e.g., conductive array line). The voltage drop signal present at bit line 910 is directed through multiplexer 920 to sense amplifier 922. Multiplexer 920 may perform its selection using decoded addresses provided by column decoder 918. Sense amplifier 922 compares a voltage drop signal to a read reference signal provided by reference cell 924. In some examples, a read reference signal provided by reference cell 924 helps sense amplifier 922 determine the resistive state of a given memory element. For example, a read reference signal may be half the difference between two resistive values (e.g., +1V and 0V are two resistive values and a read reference signal may be +0.5V) and provided to multiplexer 920, which is then used by sense amplifier 922 to determine a logical state (i.e., "1" or "0") for a selected memory element (i.e., memory elements 902a-e). Sense amplifier 922 toggles its output to a logical state, which may be evaluated to determine a binary value. Binary values are routed to interface transceiver 926, which are gated to a system bus (not shown) based on an output enable signal provided by control logic 914, which may be implemented together on the base layer of third dimensional memory array 902, as shown and described in further detail earlier in connection with FIG. 1 and as incorporated by reference above. System 900 may perform read operations using multiple ports (i.e., two or more ports) and datapaths, as described above. In other examples, system 900 and the above-described elements (i.e., all elements shown and indicated by reference numerals above) may be implemented differently in design, operation, configuration, and materials, and are not limited to the descriptions provided herein.

What is claimed is:

1. A planar memory system, comprising:
   a plurality of memory planes including
      a plurality of memory layers, each of the plurality of memory layers including a plurality of non-volatile memory elements,
      a plurality of insulation layers, each of the plurality of insulation layers being configured to separate a memory layer in said plurality of memory layers from another memory layer;
   a logic plane coupled to the plurality of memory planes, the logic plane being configured to control access to the plurality of memory planes, the plurality of memory planes being formed vertically above the logic plane; and
   a multi-port interface, the multi-port interface being configured to provide access between a plurality of ports and the plurality of memory planes.

2. The planar memory system of claim 1, wherein at least one of the plurality of memory planes comprises a plurality of resistance-based memory elements.

3. The planar memory system of claim 1, further comprising a first conductive layer configured to conduct across the memory layer when a first voltage is applied.

4. The planar memory system of claim 1, further comprising a second conductive layer configured to conduct across the memory layer when a second voltage is applied.

5. The planar memory system of claim 1, wherein each of the plurality of non-volatile memory elements is configured to change from a first resistive state to a second resistive state.

6. The planar memory system of claim 1, wherein each of the plurality of memory planes are independent of other memory planes.

7. The planar memory system of claim 1 wherein each of the plurality of memory planes is configured to provide access via at least one port of the plurality of ports.

8. The planar memory system of claim 1, wherein the plurality of memory planes are third dimensional.

9. The planar memory system of claim 1, wherein the planar memory system is non-volatile.

10. A multi-port memory system, comprising:
    a plurality of memory layers, each of the plurality of memory layers comprises a plurality of subordinate layers, each of the plurality of subordinate layers is configured to retain electrical resistive states independent of other subordinate layers each of the plurality of memory layers is formed parallel to other memory layers;
    a plurality of insulation layers, each of the plurality of insulation layers being configured to separate a memory layer in said plurality of memory layers from another memory layer;
    a plurality of ports coupled to the plurality of memory layers, each of the plurality of ports being configured to provide independent access to a subset of the plurality of memory layers;
    a plurality of x-direction conductive layers coupled to the plurality of memory layers configured to conduct a first subset of voltages; and
    a plurality of y-direction conductive layers coupled to the plurality of memory layers configured to conduct a second subset of voltages.

11. The multi-port memory system of claim 10, wherein each of the plurality of subordinate layers further comprises a subset of resistance-based memory elements.

12. The multi-port memory system of claim 11, further comprising a subset of resistance-based memory elements are configured to change from a first resistive state to a second resistive state substantially simultaneous of each other.

13. The multi-port memory system of claim 10, further comprise write drivers configured to drive the first subset of voltages or the second subset of voltages to a subset of subordinate layers in simultaneous order.

14. The multi-port memory system of claim 10, further comprise read buffers configured to receive a plurality of potential differences from a subset of subordinate layers when a third voltage is applied.

15. The multi-port memory system of claim 10, wherein the plurality of memory layers provide bidirectional data flow paths to the plurality of ports.

16. The multi-port memory system of claim 10, wherein the plurality of memory layers include third dimensional memory.

17. The multi-part memory system of claim 10, wherein at least one of the plurality of ports is designated as a master port to control access to one or more other ports.

18. The multi-port memory system of claim 10, wherein the plurality of subordinate planes are configured to share an addressing circuit to independently address a subset of resistance-based memory elements.

19. The multi-part memory system of claim 10, further comprising a port controller configured to control each independent access between the plurality of ports and the plurality of memory layers.

20. A multi-layered register file system, comprising:
    a non-volatile memory array configured to store multiple versions of a dataset within a plurality of memory planes;
    a plurality of insulation layers, each of the plurality of insulation layers being configured to separate a memory plane in said plurality of memory planes from another memory plane; and
    a gate logic plane coupled to the non-volatile array configured to manage each of the plurality of memory planes independently.

21. The multi-layered register file system of claim 20, wherein each of the plurality of memory planes comprises a cross-coupled conductive layer.

22. The multi-layered register file system of claim 20, wherein the plurality of memory planes are non-volatile.

23. The multi-layered register file system of claim 20, wherein each of the plurality of memory planes is accessible at substantially simultaneous times.

24. The multi-layered register file system of claim 20, wherein the plurality of memory planes perform a read operation independent of a preceding erase operation.

25. The multi-layered register file system of claim 20, wherein the non-volatile memory array is configured to store the dataset using a first voltage and a second voltage to perform a write operation.

26. The multi-layered register file system of claim 20, wherein each of the memory planes comprises an equivalent amount of memory elements.

* * * * *

UNITED STATES PATENT AND TRADEMARK OFFICE
CERTIFICATE OF CORRECTION

PATENT NO. : 7,633,789 B2  Page 1 of 1
APPLICATION NO. : 11/999376
DATED : December 15, 2009
INVENTOR(S) : Robert Norman It is certified that error appears in the above-identified patent and that said Letters Patent is hereby corrected as shown below:

1. In the Claims, In Column 10, Line 6, Please correct grammar by
   Inserting a --,-- after the word "layers" and before the word "each".

2. In the Claims, In Column 10, Line 30, Please correct grammar by Replacing the word "comprise" with the word "comprising".

3. In the Claims, In Column 10, Line 34, Please correct grammar by Replacing the word "comprise" with the word "comprising".

Signed and Sealed this

First Day of June, 2010

David J. Kappos
*Director of the United States Patent and Trademark Office*